United States Patent
Luong et al.

(10) Patent No.: US 8,313,661 B2
(45) Date of Patent: Nov. 20, 2012

(54) DEEP TRENCH LINER REMOVAL PROCESS

(75) Inventors: Vinh Luong, Albany, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 257 days.

(21) Appl. No.: 12/614,496

(22) Filed: Nov. 9, 2009

(65) Prior Publication Data
US 2011/0108517 A1   May 12, 2011

(51) Int. Cl.
*H01B 13/00* (2006.01)

(52) U.S. Cl. .............. 216/17; 216/37; 216/67; 438/424; 438/425; 438/426; 438/427; 438/437

(58) Field of Classification Search .............. 216/17, 216/37, 67; 438/424–427, 437
See application file for complete search history.

(56) References Cited

U.S. PATENT DOCUMENTS

| | | | | |
|---|---|---|---|---|
| 6,080,637 A * | 6/2000 | Huang et al. | ............ | 438/424 |
| 6,146,970 A * | 11/2000 | Witek et al. | ............ | 438/424 |
| 6,239,476 B1 * | 5/2001 | Gardner et al. | ............ | 257/513 |
| 6,827,869 B2 * | 12/2004 | Podlesnik et al. | ............ | 216/17 |
| 7,279,396 B2 * | 10/2007 | Derderian et al. | ............ | 438/432 |
| 7,285,433 B2 * | 10/2007 | Kretchmer et al. | ............ | 438/24 |

OTHER PUBLICATIONS

Chinese Patent Office, Office Action issued in corresponding CN Application No. 201010541047.0 (including English translation) dated Jul. 12, 2012, 9 pgs.

* cited by examiner

*Primary Examiner* — Nadine Norton
*Assistant Examiner* — Maki Angadi
(74) *Attorney, Agent, or Firm* — Wood, Herron & Evans, LLP

(57) ABSTRACT

A liner removal process is described, wherein an excess portion of a conformal liner formed in a trench is substantially removed while reducing or minimizing damage to a bulk fill material in the trench.

20 Claims, 13 Drawing Sheets

DEEP TRENCH LINER REMOVAL PROCESS

BACKGROUND OF THE INVENTION

1. Field of Invention

The invention relates to a liner removal process and, more particularly, a liner removal process for substantially removing an excess portion of a conformal liner formed in a trench while reducing or minimizing damage to a bulk fill material in the trench.

2. Description of Related Art

High dielectric constant (high-k) materials are desirable for use as capacitor dielectrics in future generations of electronic devices. The first high-k materials used as capacitor dielectrics were tantalum oxide and aluminum oxide materials. Currently, hafnium-based dielectrics are expected to enter production as gate dielectrics, thereby replacing the current silicon oxide and silicon oxynitride materials. However, the practical integration of current high-k dielectric materials, currently under evaluation, suffers from various problems. For example, following the conformal deposition of the capacitor dielectric in the capacitor trench, an undesirable recess is formed in the bulk fill material when performing an etching process to remove any excess portion of the capacitor dielectric extending outside the trench and/or beyond the bulk fill material in the trench. The formation of the undesirable recess occurs due to the poor etch selectivity between the capacitor dielectric and the bulk fill material.

SUMMARY OF THE INVENTION

The invention relates to a liner removal process and, more particularly, a liner removal process for substantially removing an excess portion of a conformal liner formed in a trench while reducing or minimizing damage to a bulk fill material in the trench.

According to one embodiment, a liner removal process is described. The liner removal process comprises forming a trench in a substrate, depositing a conformal liner within the trench, and filling the trench with a bulk fill material. Furthermore, the liner removal process comprises selectively removing an excess portion of the conformal liner by alternatingly forming a protective layer on an exposed surface of the bulk fill material and etching the conformal liner.

According to another embodiment, a liner removal process is described. The liner removal process comprises forming a trench in a substrate, depositing a conformal high-k liner within the trench, and filling the trench with a polysilicon layer. Furthermore, the liner removal process comprises selectively removing an excess portion of the conformal high-k liner by performing the following: oxidizing an exposed surface of the polysilicon layer in the trench by exposing the exposed surface to an oxygen-containing plasma; following the oxidizing, etching the conformal high-k liner using plasma formed of a process gas having a halogen-containing gas, and repeating the oxidizing and the etching until the excess portion of the conformal high-k liner is substantially removed.

DETAILED DESCRIPTION OF SEVERAL EMBODIMENTS

Figure 1A:
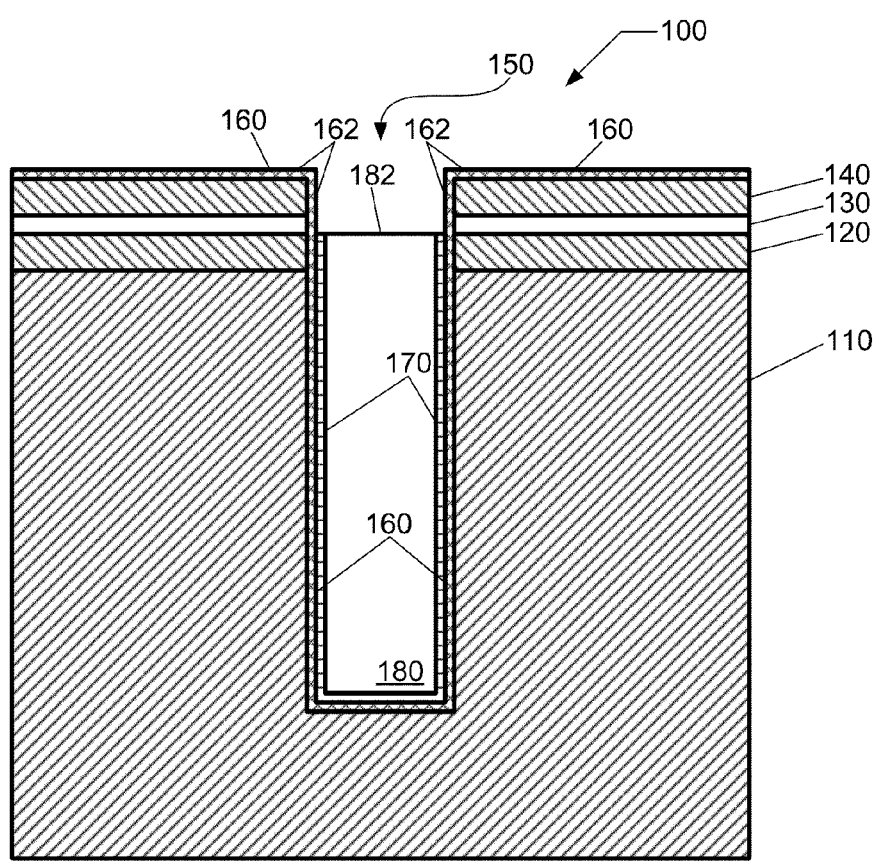
FIGS. 1A through 1E illustrate a schematic representation of a liner removal process according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described above, during a liner removal process, poor etch selectivity between the liner and the bulk fill material can lead to damage and, more specifically, the formation of a recess in the bulk fill material. Therefore, according to several embodiments, a liner removal process is described for substantially removing an excess portion of a conformal liner formed in a trench while reducing or minimizing damage to a bulk fill material in the trench.

Referring now to the drawings, wherein like reference numerals designate identical or corresponding parts throughout the several views, FIGS. 1A through 1E, and FIG. 2 depict a liner removal process according to an embodiment. The method is illustrated in a flow chart 200, and begins in 210 with forming a trench 150 in a substrate 110. The trench may include a trench for use in an electronic device, such as a trench capacitor or buried capacitor in a memory device.

As shown in FIG. 1A, the trench 150 is formed through one or more layers (120, 130, 140) and into substrate 110. The formation of trench 150 may include one or more dry etching processes, or one or more wet etching processes, or a combination thereof.

The one or more layers formed on substrate 110 may include a pad oxide layer 120, an intermediate layer 130, and a stop layer 140. For example, the pad oxide layer 120 may include silicon oxide ($SiO_x$), the intermediate layer 130 may include silicon, and the stop layer 140 may include silicon nitride ($SiN_y$). The stop layer 140 may also include a carbide (e.g., $SiC_x$) layer, an oxynitride (e.g., $SiO_xN_y$) layer, a carbonitride (e.g., $SiC_xN_y$) layer, or other dielectric layer, which resists erosion during subsequent planarization and etching.

The pad oxide layer 120 may be provided atop the substrate 110, for example, either by deposition or by oxidizing process(es). In the latter, oxidation may include heating the substrate 110 in an oxygen ambient at high temperature (e.g., 800 degrees C. to about 1100 degrees C.) until the oxide is formed on the surface of the substrate 110. It is also possible to form the pad oxide layer 120 by conventional deposition processes such as, but not limited to: chemical vapor deposition (CVD), plasma-enhanced CVD (PECVD), atomic layer deposition (ALD), plasma enhanced ALD (PEALD), or physical vapor deposition (PVD).

The intermediate layer 130 and the stop layer 140 may be formed using vapor deposition processes such as, but not limited to: chemical vapor deposition (CVD), plasma-enhanced CVD (PECVD), atomic layer deposition (ALD), plasma enhanced ALD (PEALD), or physical vapor deposition (PVD).

In 220, once the trench 150 is formed in substrate 110, a conformal liner 160 is deposited within the trench 150. The conformal liner 160 may include a dielectric material, such as a high dielectric constant (high-k) material. The high-k dielectric material may have a dielectric constant greater than 4. For instance, the high-k dielectric material may include an oxide, such as a metal oxide. Additionally, for instance, the high-k dielectric material may include aluminum oxide ($Al_2O_3$), lanthanum oxide ($La_2O_3$), zirconium oxide ($ZrO_2$), hafnium oxide ($HfO_2$), an aluminate such as hafnium aluminate (HfAlO), zirconium silicate ($ZrSiO_4$), hafnium silicate ($HfSiO_4$), or hafnium silicon oxynitride (HfSiON). Additionally, for instance, the high-k dielectric material may include mixtures of high-k materials. The conformal liner 160 may be deposited using a vapor deposition process such as, but not limited to: chemical vapor deposition (CVD), plasma-enhanced CVD (PECVD), atomic layer deposition (ALD), plasma enhanced ALD (PEALD), or physical vapor deposition (PVD).

In 230, the trench 150 is filled with a bulk fill material 180. The bulk fill material 180 may serve as an electrode or part of an electrode in a trench/buried capacitor. The bulk fill material 180 may include polycrystalline silicon (poly-silicon). The trench fill process may include a vapor deposition process such as, but not limited to: chemical vapor deposition (CVD), plasma-enhanced CVD (PECVD), or physical vapor deposition (PVD).

Additionally, an electrode layer 170 may be disposed between the conformal liner 160 and the bulk fill material 180. The electrode layer 170 may include undoped poly-silicon, doped poly-silicon, tantalum (Ta), tantalum nitride (TaN), tantalum titanium (TaTi), tantalum platinum (TaPt), tantalum silicon nitride (TaSiN), titanium (Ti), titanium nitride (TiN), titanium aluminide ($Ti_3Al$), titanium aluminum nitride ($Ti_2AlN$), tungsten (W), tungsten nitride (WN), tungsten silicide (WSi), hafnium (Hf), hafnium nitride (HfN), niobium (Nb), molybdenum (Mo), molybdenum nitride ($Mo_2N$), ruthenium (Ru), ruthenium dioxide ($RuO_2$), nickel silicide (NiSi), palladium (Pd), iridium (Ir), platinum (Pt), cobalt (Co), cobalt silicide (CoSi), or aluminum silicide (AlSi), or any combination of two or more thereof. The electrode layer 170 may be deposited using a vapor deposition process such as, but not limited to: chemical vapor deposition (CVD), plasma-enhanced CVD (PECVD), atomic layer deposition (ALD), plasma enhanced ALD (PEALD), or physical vapor deposition (PVD).

The bulk fill material 180 and the electrode layer 170 may be trimmed, using etching and/or planarization processes, to leave an exposed surface 182 on the bulk fill material 180 and expose an excess portion 162 of the conformal liner 160.

In 240 and as shown in FIGS. 1B through 1E, the excess portion 162, 162' of conformal liner 160 is removed by alternatingly forming a protective layer 190, 190' on an exposed surface 182, 182' of the bulk fill material 180 and etching the excess portion 162, 162' of the conformal liner 160. The formation of the protective layer 190, 190' and the etch of the excess portion 162, 162' of the conformal liner 160 may be performed sequentially with or without overlap.

Figure 1B:
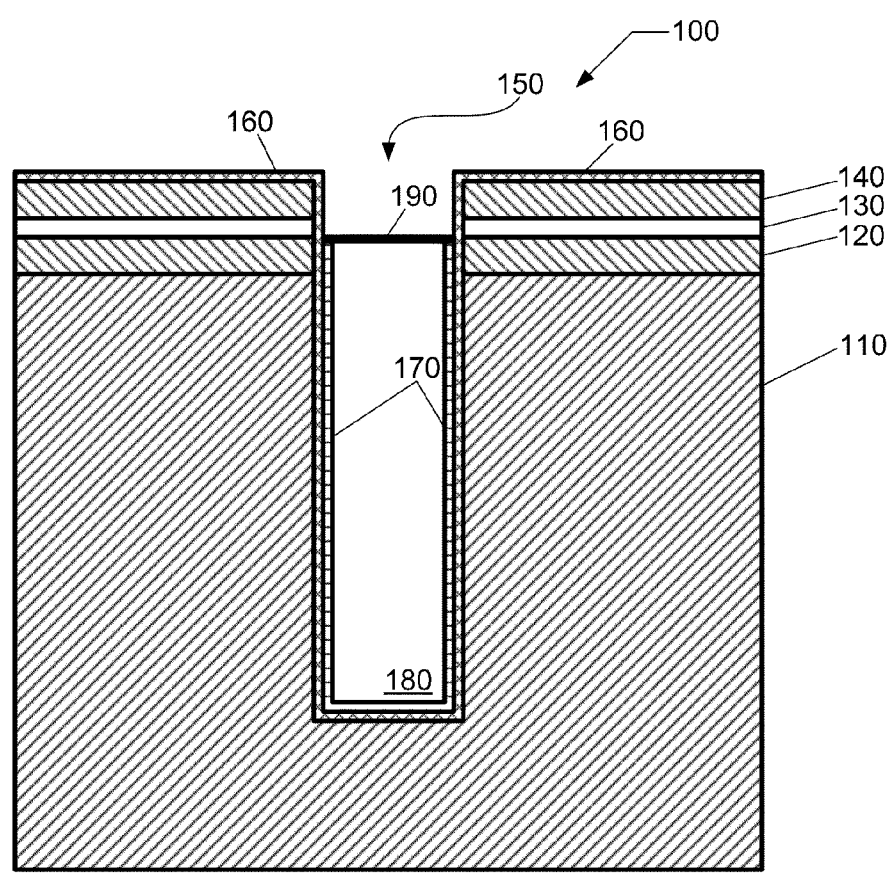
Figure 1C:
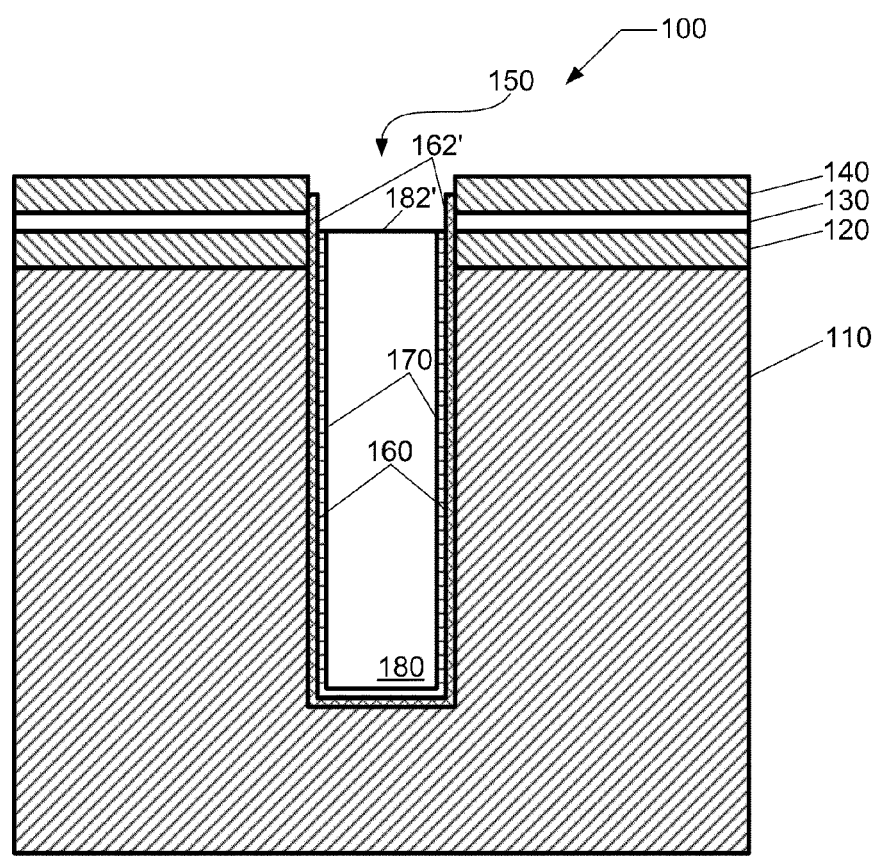
Figure 1D:
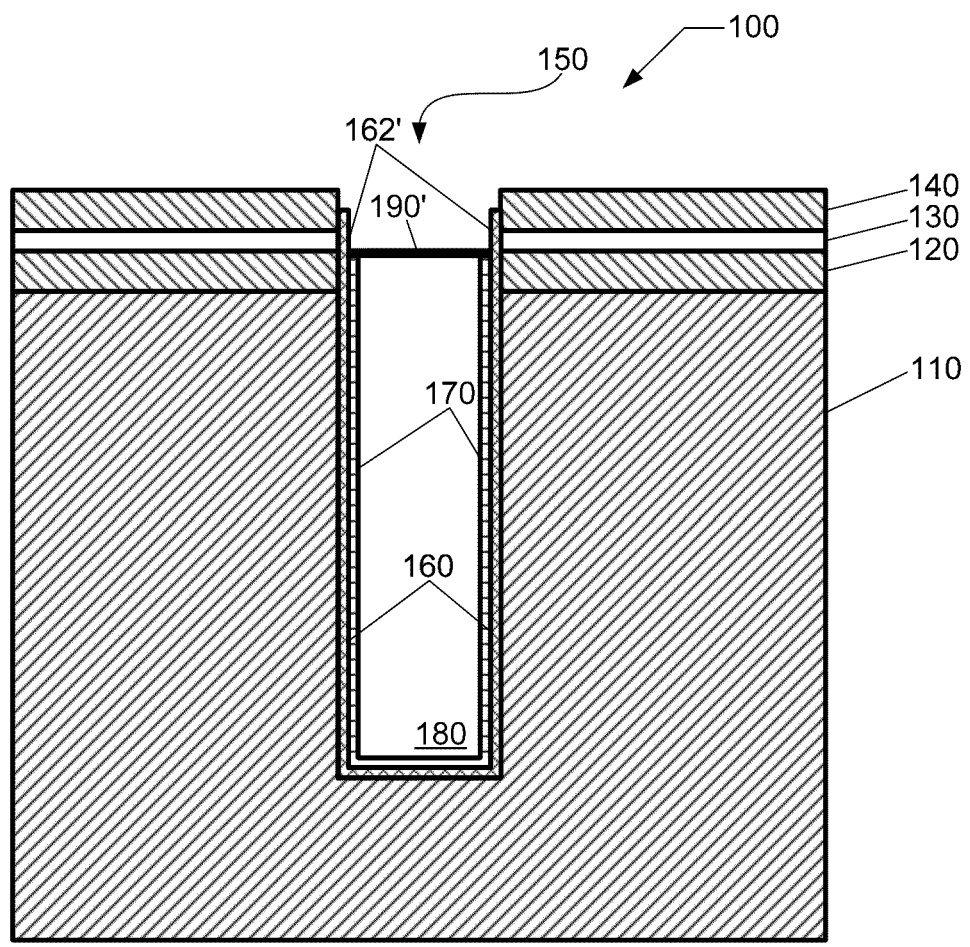
Figure 1E:
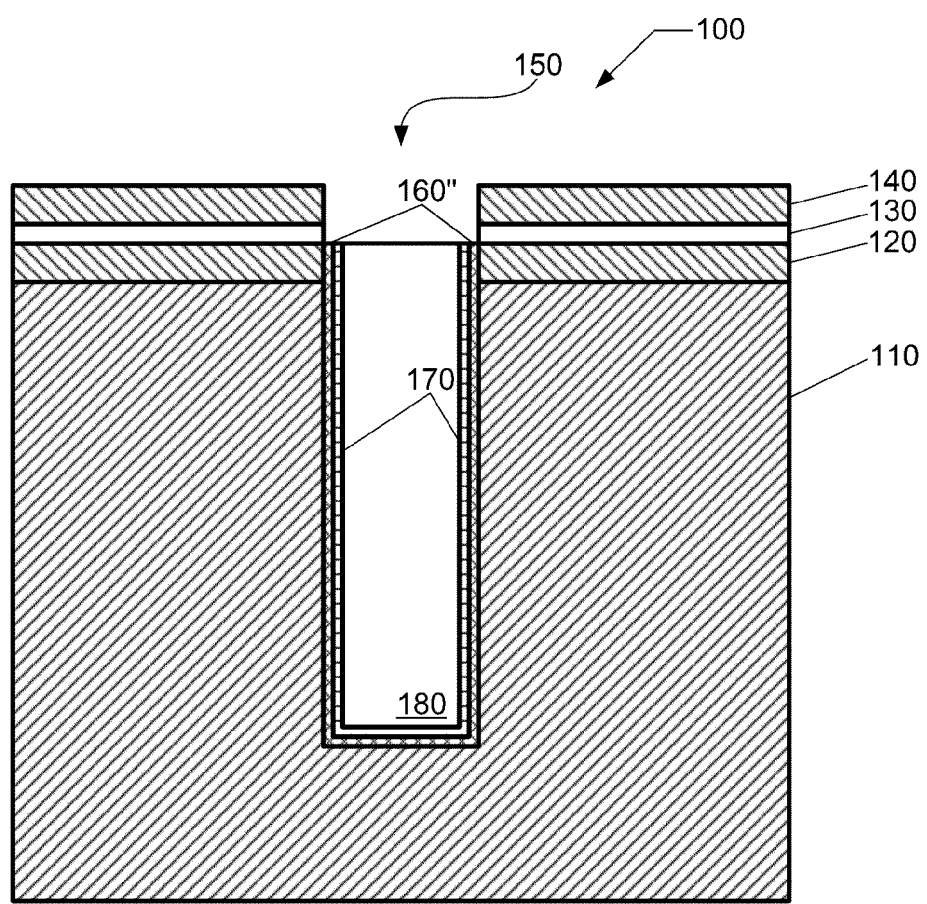

As illustrated in FIGS. 1B and 1C, protective layer 190 is formed on the exposed surface 182 of bulk fill material 180 and the excess portion 162 of conformal liner 160 is etched until the protective layer 190 is fully consumed. However, the excess portion 162 of conformal liner 160 may be etched until the protective layer 190 is partly consumed. Thereafter, as illustrated in FIGS. 1D and 1E, another protective layer 190' is formed on the newly exposed surface 182' of bulk fill material 180 and the remaining excess portion 162' of conformal liner 160 is etched until the protective layer 190' is partly or fully consumed. As illustrated in FIGS. 1B through 1E, the excess portion 162, 162' of the conformal liner 160 is trimmed using two cycles; however, more or less cycles may be used and/or required.

According to one embodiment, the protective layer 190, 190' is formed by depositing a thin film of material on the exposed surface 182, 182' of the bulk fill material 180, or growing a thin film of material on the exposed surface 182, 182' of the bulk fill material 180, or both depositing and growing a thin film of material on the exposed surface 182, 182' of the bulk fill material 180. For example, a vapor deposition process, such as chemical vapor deposition (CVD), plasma-enhanced CVD (PECVD), atomic layer deposition (ALD), plasma enhanced ALD (PEALD), or physical vapor deposition (PVD), may be used to form the thin film.

According to another embodiment, the protective layer 190, 190' is formed by oxidizing the exposed surface 182, 182' of the bulk fill material 180. Alternatively, the protective layer 190, 190' is formed by nitriding the exposed surface 182, 182' of the bulk fill material 180. For example, the formation of the protective layer 190, 190' may comprise exposing the substrate 110 to an oxygen-containing gas selected from the group consisting of O radical, $O_2$, ozone, CO, $CO_2$, NO, $N_2O$, or $NO_2$.

According to another embodiment, the protective layer 190, 190' is formed by exposing the substrate 110 to a non-plasma gaseous environment. According to another embodiment, the protective layer 190, 190' is formed by exposing the substrate 110 to plasma. According to yet another embodiment, the protective layer 190, 190' is formed by exposing the substrate 110 to an ion beam or a gas cluster ion beam.

According to one embodiment, the excess portion 162, 162' of the conformal liner 160 is trimmed using a wet etching process, or a dry etching process, or both. The dry etching process may include a dry plasma etching process. The dry plasma etching process may include a plasma etching process using a process gas having a halogen-containing gas and an optional noble gas. For example, the halogen-containing gas may be selected from the group consisting of HBr, $Cl_2$, or $BCl_3$. The process gas may further include a hydrocarbon gas. For example, the hydrocarbon gas may include a gas selected from the group consisting of $O_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $O_6H_6$, $C_6H_{10}$, and $C_6H_{12}$.

The formation of the protective layer 190, 190' and the etching of the excess portion 162, 162' of the conformal liner may take place in the same processing system. Alternatively, the formation of the protective layer 190, 190' and the etching of the excess portion 162, 162' of the conformal liner may take place in separate processing systems.

Figure 3:
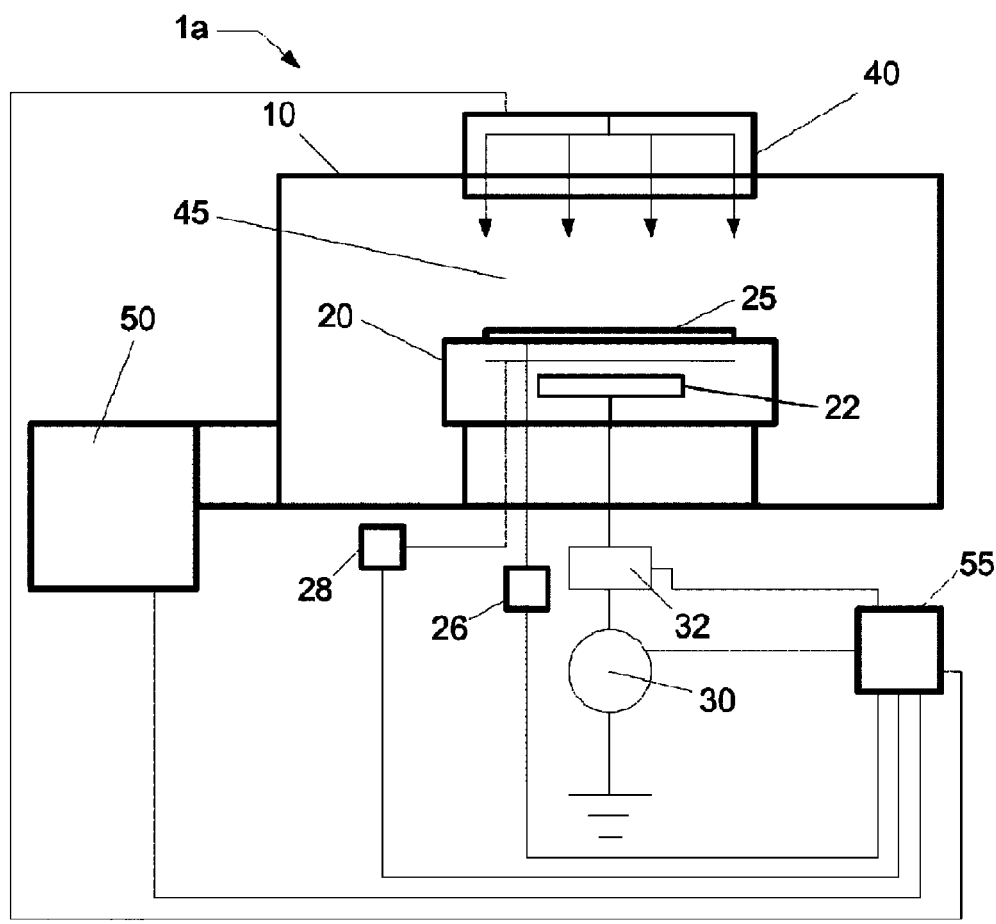
FIG. 3 shows a schematic representation of a processing system according to an embodiment.

According to one embodiment, a processing system 1a configured to perform the above identified process conditions is depicted in FIG. 3 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 3, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a non-plasma or plasma assisted process on substrate 25.

Controller 55 can be locally located relative to the processing system 1a, or it can be remotely located relative to the processing system 1a. For example, controller 55 can exchange data with processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

Figure 2:
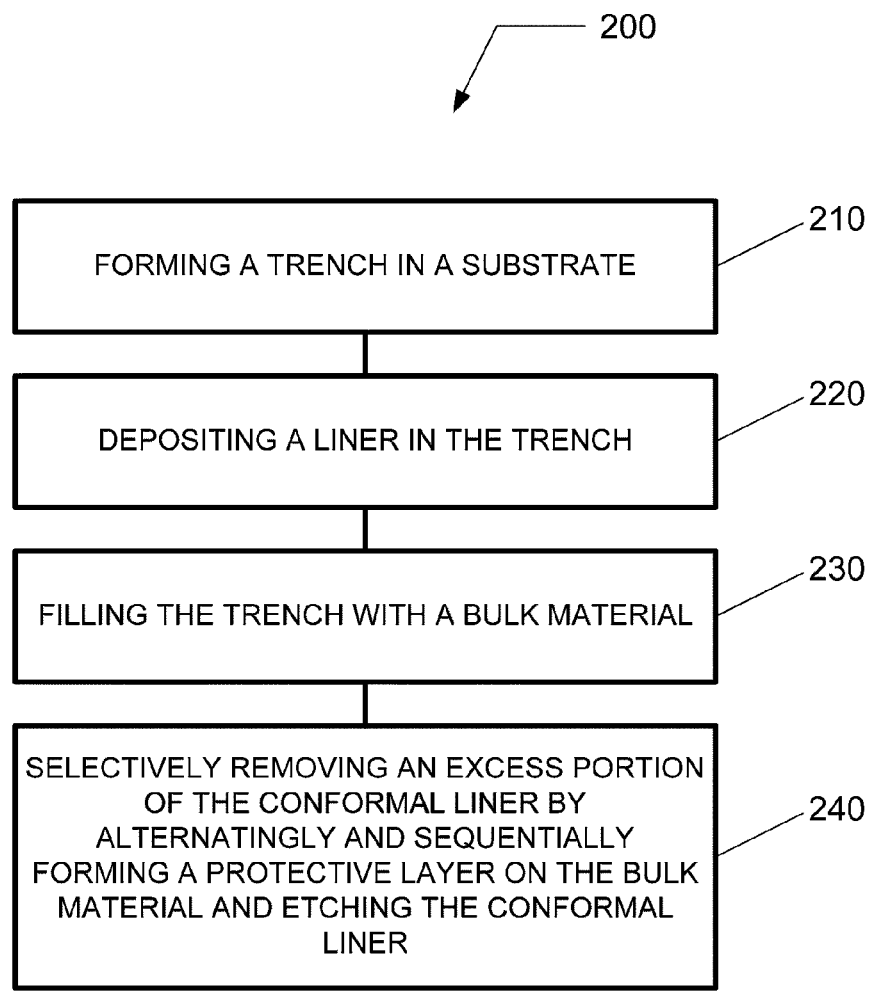
FIG. 2 provides a flow chart for performing a liner removal process according to another embodiment.

In the embodiment shown in FIG. 4, processing system 1b can be similar to the embodiment of FIG. 3 and further comprise either a stationary, or mechanically or electrically rotating magnetic field system 60, in order to potentially increase plasma density and/or improve plasma processing uniformity, in addition to those components described with reference to FIG. 2. Moreover, controller 55 can be coupled to magnetic field system 60 in order to regulate the speed of rotation and field strength. The design and implementation of a rotating magnetic field is well known to those skilled in the art.

Figure 4:
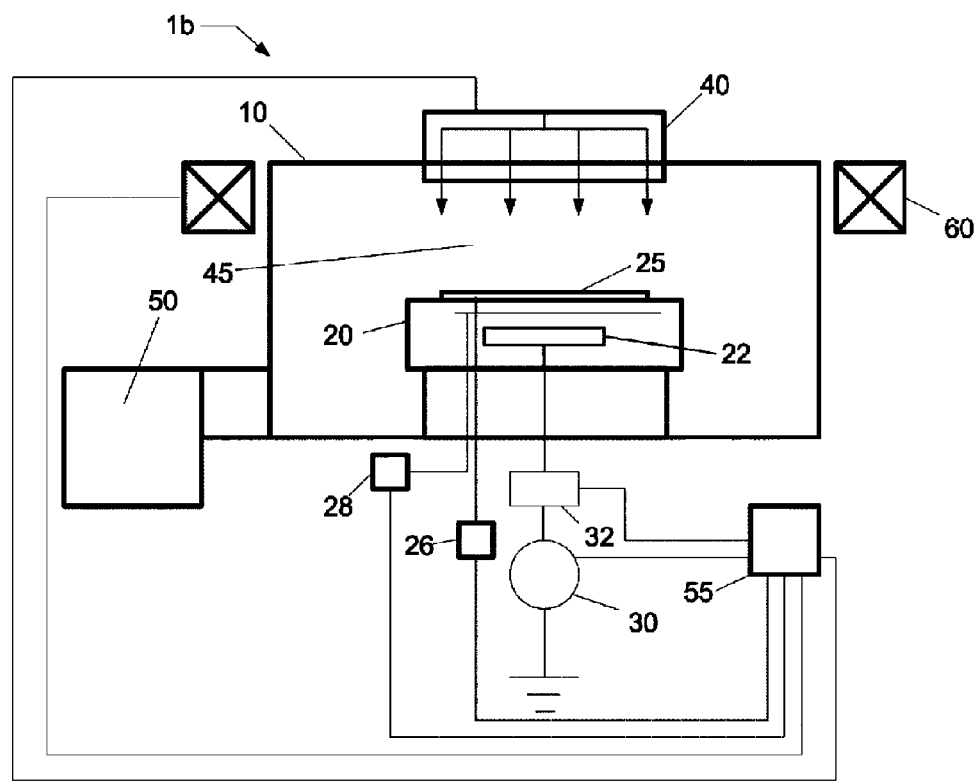
FIG. 4 shows a schematic representation of a processing system according to another embodiment.
Figure 5:
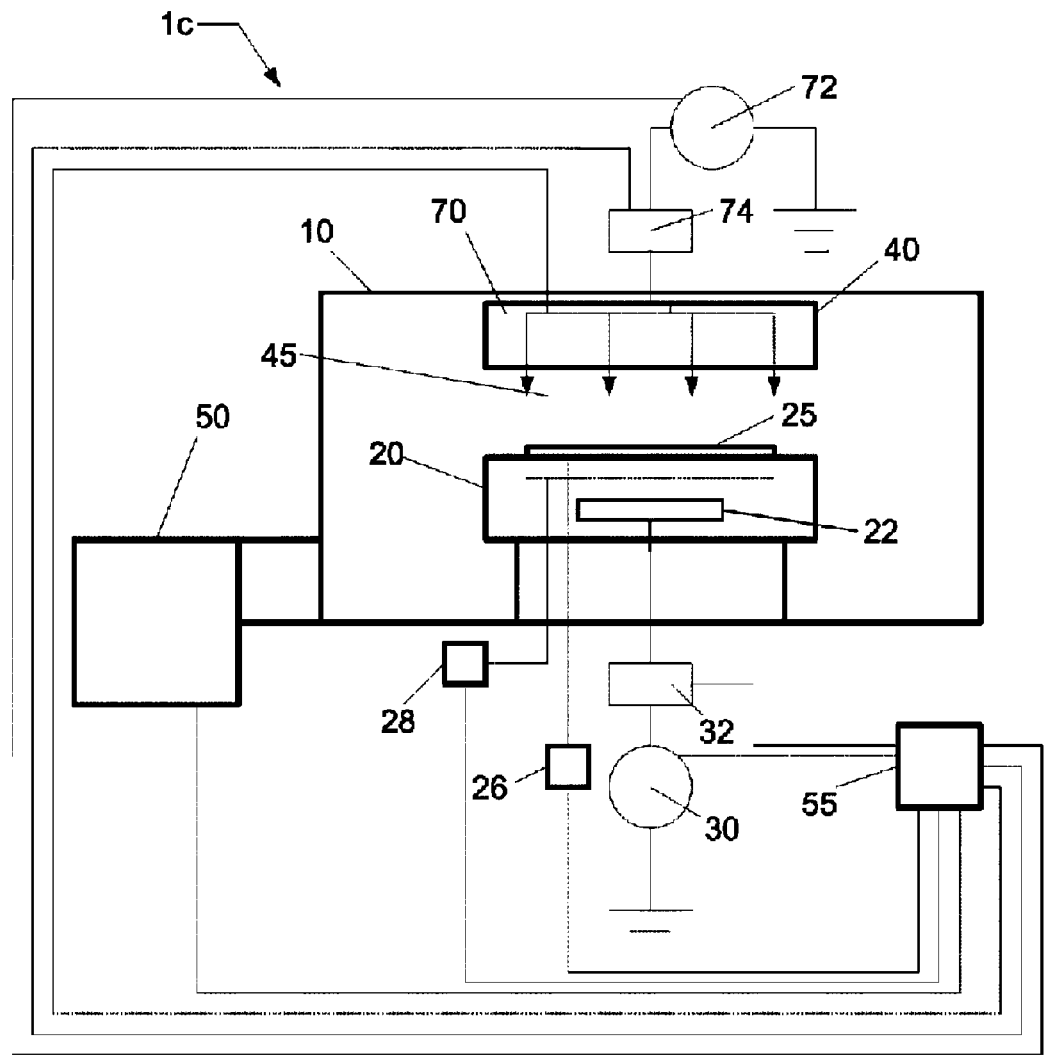
FIG. 5 shows a schematic representation of a processing system according to another embodiment.

In the embodiment shown in FIG. 5, processing system 1c can be similar to the embodiment of FIG. 3 or FIG. 4, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 6:
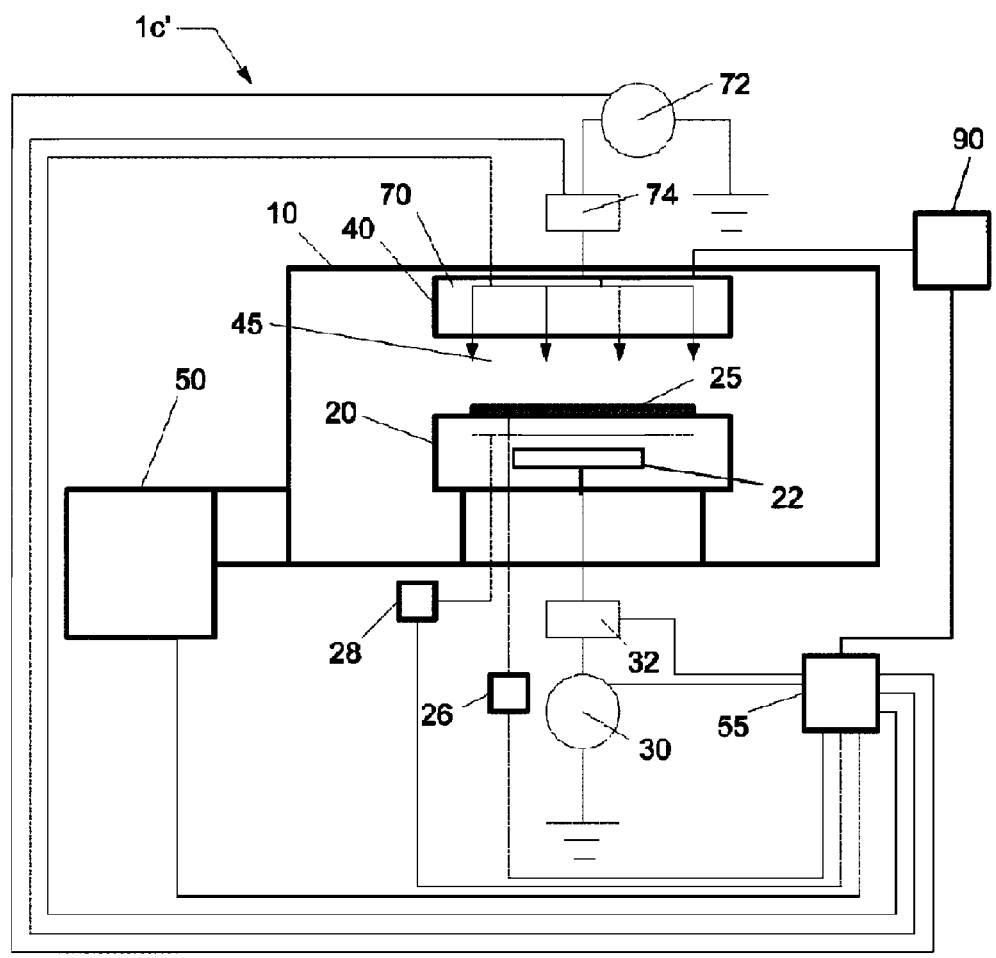
FIG. 6 shows a schematic representation of a processing system according to another embodiment.

In the embodiment shown in FIG. 6, processing system 1c' can be similar to the embodiment of FIG. 5, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 7:
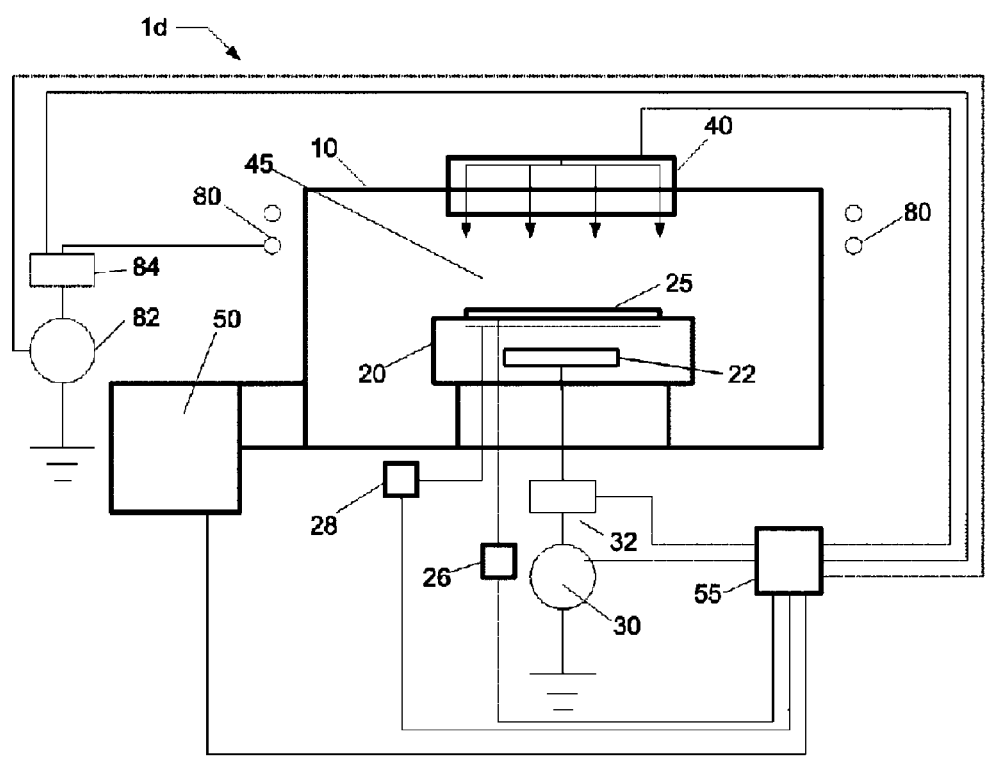
FIG. 7 shows a schematic representation of a processing system according to another embodiment.

In the embodiment shown in FIG. 7, the processing system 1d can be similar to the embodiments of FIGS. 3 and 4, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 8:
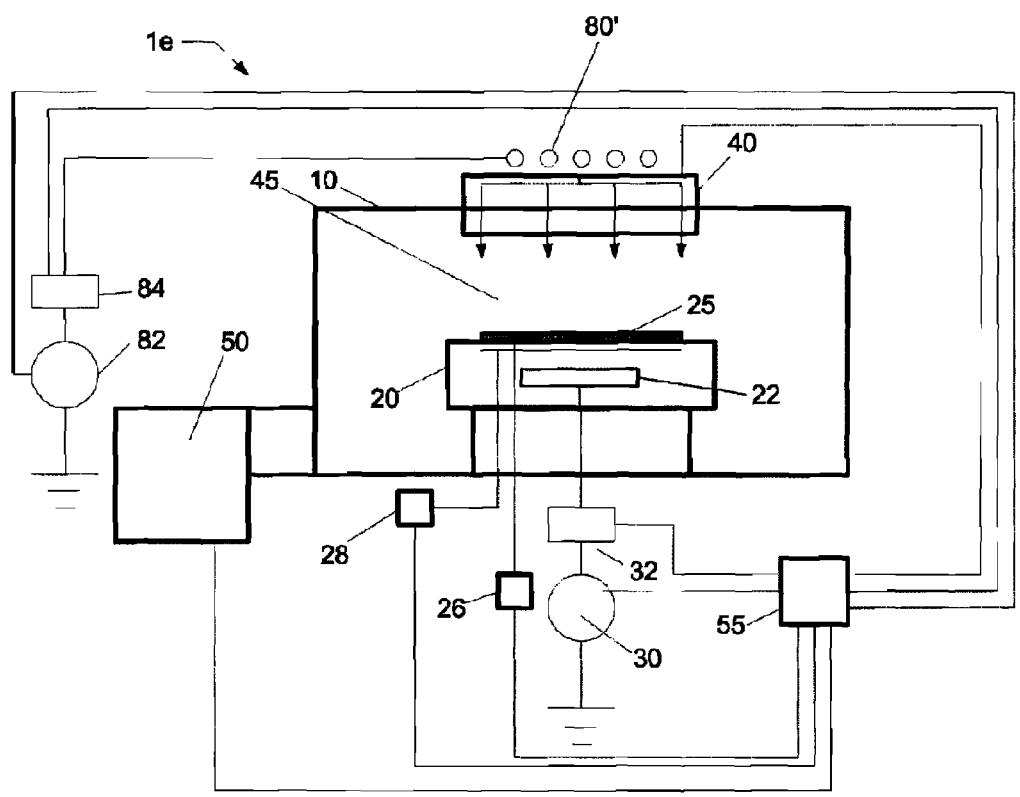
FIG. 8 shows a schematic representation of a processing system according to another embodiment.

In an alternate embodiment, as shown in FIG. 8, the processing system 1e can be similar to the embodiment of FIG. 7, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 9:
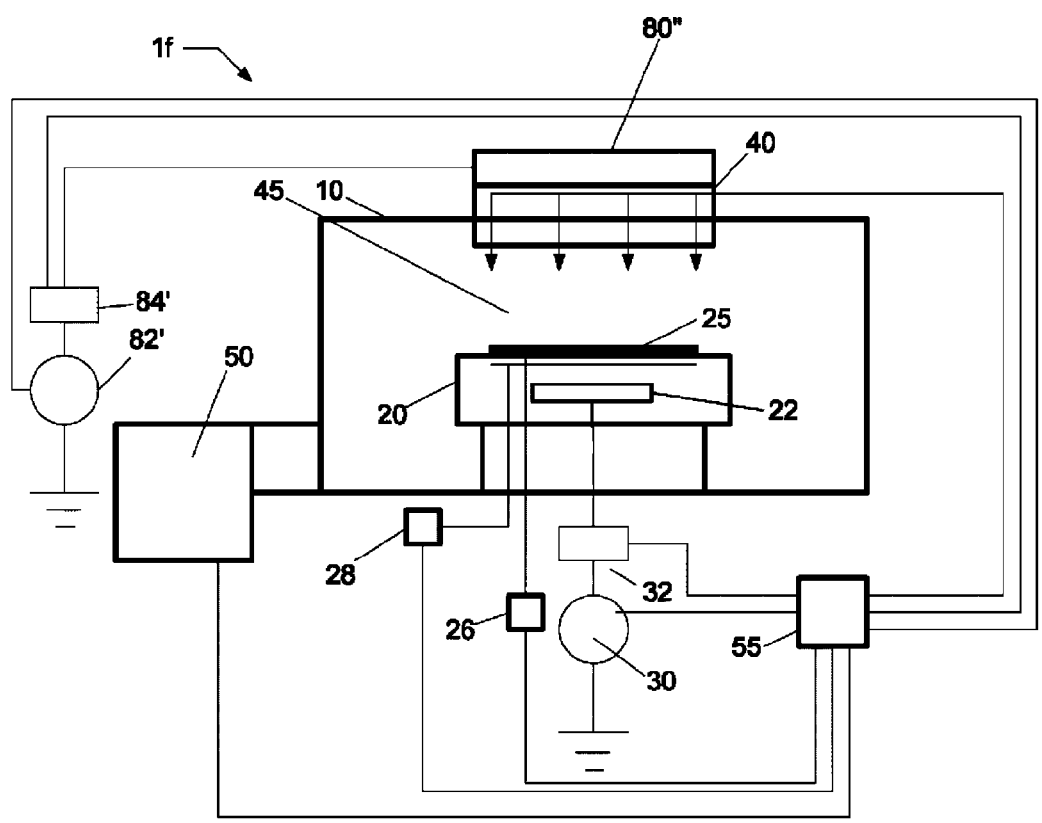
FIG. 9 shows a schematic representation of a processing system according to another embodiment.

In the embodiment shown in FIG. 9, the processing system if can be similar to the embodiment of FIG. 3, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In the following discussion, a method of removing a liner is presented. For example, the processing system can comprise various elements, such as described in FIGS. 3 through 9, and combinations thereof.

According to one example, a trench capacitor is prepared having a high-k liner (such as a hafnium oxide ($HfO_2$) liner), and a metal/poly-silicon electrode (such as a TiN/poly-silicon electrode). Therein, the high-k liner (e.g., $HfO_2$) is conformally applied followed by a conformal deposition of a metal (TiN) layer and a fill of the remaining trench with poly-silicon. The excess portion of the high-k liner is removed by: oxidizing an exposed surface of the polysilicon layer in the trench via exposing the exposed surface layer to an oxygen-containing plasma; following the oxidizing, etching the conformal high-k liner using plasma formed of a process gas having a halogen-containing gas; and repeating the oxidizing and the etching until the excess portion of the conformal high-k liner is substantially removed.

The oxidation process may comprise a process parameter space including: a chamber pressure ranging up to about 1000 mtorr (millitorr) (e.g., about 10 mtorr), an $O_2$ process gas flow rate ranging up to about 2000 sccm (standard cubic centimeters per minute) (e.g., about 200 sccm), an upper electrode (e.g., element 70 in FIG. 5) RF bias ranging up to about 2000 W (watts) (e.g., about 400 W), and a lower electrode (e.g., element 22 in FIG. 5) RF bias ranging up to about 1000 W (e.g., about 0 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

The etching process may comprise a process parameter space including: a chamber pressure ranging up to about 1000 mtorr (millitorr) (e.g., about 10 mtorr), a $BCl_3$ process gas flow rate ranging up to about 2000 sccm (standard cubic centimeters per minute) (e.g., about 150 sccm), a He process gas flow rate ranging up to about 2000 sccm (e.g., about 150 sccm), a $C_2H_4$ process gas flow rate ranging up to about 2000 sccm (e.g., about 1 sccm), an upper electrode (e.g., element 70 in FIG. 5) RF bias ranging up to about 2000 W (watts) (e.g., about 600 W), and a lower electrode (e.g., element 22 in FIG. 5) RF bias ranging up to about 1000 W (e.g., about 0 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Using the above identified conditions, the inventors have observed that the etch selectivity between etching the high-k liner and the poly-silicon material may be increased by oxidizing the exposed surface layer of the poly-silicon to form an $SiO_x$ layer and etching the high-k liner using the aforementioned process composition. As a result, the etch selectivity may be increased above 30-to-1 (between the high-k liner and the poly-silicon material). Additionally, as a result, the etch selectivity may be increased above 40-to-1. Additionally yet, as a result, the etch selectivity may be increased above 50-to-1.

In one embodiment, RF power is supplied to the upper electrode and not the lower electrode. In another alternate embodiment, RF power is supplied to the lower electrode and not the upper electrode. In yet another embodiment, RF power is supplied to the lower electrode and the upper electrode.

The time to remove the liner can be determined using design of experiment (DOE) techniques; however, it can also be determined using endpoint detection or some combination thereof. One possible method of endpoint detection is to monitor a portion of the emitted light spectrum from the plasma region that indicates when a change in plasma chemistry occurs due to substantially near completion of the removal of liner from the substrate.

As another example, the recess in the poly-silicon layer has been found to be substantially reduced and/or minimized using the following process recipe in Table 1. The process recipe for removing the high-k liner is compared with a reference condition that does not include forming a protective layer (i.e., oxidation of the poly-silicon material).

readily appreciate that many modifications are possible in the embodiments without materially departing from the novel teachings and advantages of this invention. Accordingly, all such modifications are intended to be included within the scope of this invention.

The invention claimed is:

1. A liner removal process, comprising:
    forming a trench in a substrate;
    depositing a conformal liner within said trench;
    filling said trench with a bulk fill material; and
    selectively removing an excess portion of said conformal liner by alternatingly forming a protective layer on an exposed surface of said bulk fill material and etching said conformal liner.

2. The method of claim 1, wherein said bulk fill material contains polycrystalline silicon.

3. The method of claim 1, wherein said conformal liner comprises a high dielectric constant (high-k) layer.

4. The method of claim 1, wherein said conformal liner contains hafnium.

5. The method of claim 1, wherein said forming said protective layer comprises depositing said protective layer on said exposed surface of said bulk fill material, or growing said protective layer on said exposed surface of said bulk fill material, or both depositing and growing said protective layer on said exposed surface of said bulk fill material.

6. The method of claim 1, wherein said forming said protective layer comprises oxidizing said exposed surface of said bulk fill material.

7. The method of claim 1, wherein said forming said protective layer comprises exposing said substrate to an oxygen-containing gas selected from the group consisting of O radical, $O_2$, ozone, CO, $CO_2$, NO, $N_2O$, or $NO_2$.

8. The method of claim 1, wherein said forming said protective layer comprises exposing said substrate to a non-plasma gaseous environment.

9. The method of claim 1, wherein said forming said protective layer comprises exposing said substrate to plasma.

10. The method of claim 1, wherein said forming said protective layer comprises exposing said substrate to an ion beam or a gas cluster ion beam.

11. The method of claim 1, wherein said forming said protective layer comprises depositing said protective layer on said substrate using a vapor deposition process.

12. The method of claim 1, wherein said etching said conformal liner comprises performing a wet etching process, or a dry etching process, or both.

13. The method of claim 1, wherein said etching said conformal liner comprises performing a plasma etching process using a process gas having a halogen-containing gas and an optional noble gas.

14. The method of claim 13, wherein said halogen-containing gas is selected from the group consisting of HBr, $Cl_2$, or $BCl_3$.

TABLE 1

| Oxidize/Etch Condition | Pressure (mtorr) | UEL Power (W) | LEL Power (W) | $O_2$ Flow Rate (sccm) | $BCl_3$ Flow Rate (sccm) | $C_2H_4$ Flow Rate (sccm) | He Flow Rate (sccm) | Time (sec) |
|---|---|---|---|---|---|---|---|---|
| Reference | 20 | 600 | 0 | 0 | 150 | 0 | 150 | 180 |
| 1 (Oxidize) | 10 | 400 | 0 | 200 | 0 | 0 | 0 | 60 |
| 2 (Etch) | 10 | 600 | 0 | 0 | 150 | 1 | 150 | 173.4 |

Although only certain embodiments of this invention have been described in detail above, those skilled in the art will 15. The method of claim 13, wherein said process gas further comprises a hydrocarbon gas.

16. The method of claim 15, wherein said hydrocarbon gas is selected from the group consisting of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$.

17. The method of claim 1, wherein said forming said protective layer precedes said etching said conformal liner, and wherein said etching is performed for a duration of time sufficient to substantially consume said protective layer.

18. A liner removal process, comprising:
   forming a trench in a substrate;
   depositing a conformal high-k liner within said trench;
   filling said trench with a polysilicon layer; and
   selectively removing an excess portion of said conformal high-k liner by performing the following:
      oxidizing an exposed surface of said polysilicon layer in said trench by exposing said exposed surface to an oxygen-containing plasma,
      following said oxidizing, etching said conformal high-k liner using plasma formed of a process gas having a halogen-containing gas, and
      repeating said oxidizing and said etching until said excess portion of said conformal high-k liner is substantially removed.

19. The method of claim 18, wherein said conformal high-k layer contains hafnium, and said process gas comprises $BCl_3$ and a hydrocarbon gas.

20. The method of claim 18, wherein an etch selectivity for said selectively removing said excess portion of said conformal high-k liner exceeds about 30-to-1, said etch selectivity representing a ratio of an etch rate of said conformal high-k liner to an etch rate of said polysilicon layer.

* * * * *

UNITED STATES PATENT AND TRADEMARK OFFICE
CERTIFICATE OF CORRECTION

PATENT NO. : 8,313,661 B2
APPLICATION NO. : 12/614496
DATED : November 20, 2012
INVENTOR(S) : Vinh H. Luong et al.

Page 1 of 1

It is certified that error appears in the above-identified patent and that said Letters Patent is hereby corrected as shown below:

In Col. 8, lines 38-39, "system if can be similar" should read --system $1f$ can be similar--.

Signed and Sealed this
Twelfth Day of February, 2013

Teresa Stanek Rea
*Acting Director of the United States Patent and Trademark Office*